United States Patent
Fujita et al.

(10) Patent No.: US 6,383,254 B1
(45) Date of Patent: May 7, 2002

(54) TREATMENT SOLUTION AND TREATMENT METHOD FOR REDUCING COPPER OXIDES

(75) Inventors: Yasuji Fujita; Kenji Ikeshima, both of Tokyo (JP)

(73) Assignee: Meltex Inc., Tokyo (JP)

( * ) Notice: Subject to any disclaimer, the term of this patent is extended or adjusted under 35 U.S.C. 154(b) by 0 days.

(21) Appl. No.: 09/895,321

(22) Filed: Jul. 2, 2001

(30) Foreign Application Priority Data

Aug. 10, 2000 (JP) ........................................ 2000-242412

(51) Int. Cl.$^7$ .............................. C22B 15/00; H05K 3/38
(52) U.S. Cl. ..................... 75/721; 148/269; 148/272; 216/20; 216/34; 216/105; 252/79.1; 252/188.2
(58) Field of Search ........................... 75/721; 252/79.1, 252/188.2; 216/20, 34, 105; 148/269, 272

(56) References Cited

U.S. PATENT DOCUMENTS 6,322,656 B1 * 11/2001 Fakler et al. ............... 148/272

FOREIGN PATENT DOCUMENTS

| JP | 61-176192 | 8/1986 |
|----|-----------|--------|
| JP | 64-8479 | 2/1989 |
| JP | 1-156479 | 6/1989 |
| JP | 3-50431 | 8/1991 |
| JP | 5-160564 | 6/1993 |

* cited by examiner

*Primary Examiner*—Melvyn Andrews
(74) *Attorney, Agent, or Firm*—Oblon, Spivak, McClelland, Maier & Neustadt, P.C.

(57) ABSTRACT

There are provided a treatment solution for reducing a copper oxide formed on the surface of copper to copper, wherein dimethylamine borane is contained in an amount of 0.3 to 2.0 g/L and the relationship $y \geq 0.232 x^{-0.185}$ holds between the concentration y (g/L) of dimethylamine borane and an area x (dm$^2$/L) to be treated per unit solution amount, and a treatment method for reducing a copper oxide formed on the surface of a copper material to copper by dipping the copper material in the treatment solution as described above, wherein the addition of dimethylamine borane to water is carried out within 10 minutes before the dipping of the copper material or after the dipping of the copper material.

6 Claims, No Drawings

TREATMENT SOLUTION AND TREATMENT METHOD FOR REDUCING COPPER OXIDES

BACKGROUND OF THE INVENTION

The present invention relates to a treatment solution and a treatment method for reducing a copper oxide having enhanced adhesion to resins and, particularly, to a treatment solution and a treatment method for enhancing the adhesion of copper wires for an internal layer to a resin layer in the production of a multilayer printed-wiring board and enhancing the acid resistance of the copper wires for an internal layer.

In the production of the multilayer printed-wiring board, since the adhesion of the copper wires for an internal layer which are laminated on and bonded to the resin layer is weak when the surface of the copper wire is smooth, a layer of copper oxide such as copper (I) oxide or copper (II) oxide has been heretofore formed on the surface of the copper wire. Since this copper oxide layer has roughness on the surface, it exhibits a mechanical anchoring effect to the resin layer, and since the copper oxide layer has large chemical affinity for the resin layer, it exhibits significantly excellent adhesion to the resin layer.

However, the above copper oxide layer has poor acid resistance. For example, there occurs the phenomenon that the copper oxide layer bonded to the resin layer is dissolved by a hydrochloric acid solution for feeding a catalyst for electroless plating in the through hole plating step after the lamination and bonding step.

To prevent this phenomenon from occurring, copper wires for an internal layer which have adhesion and acid resistance are produced by reducing the copper oxide layer to copper. As the method for reducing the copper oxide layer, there are known a method in which the copper oxide layer is brought into contact with an alkali aqueous solution containing a reducing agent such as sodium borohydride or formalin (Japanese Patent Publication No. 8479/1989), a two-step method in which the copper oxide layer is dipped in sodium boroalkali and formalin successively (Japanese Patent Application Laid-Open No. 156479/1989), a method using dimethylamine borane as a reducing agent (Japanese Patent Application Laid-Open No. 176192/1986 and Japanese Patent Publication No. 50431/1991), a two-step method in which the copper oxide layer is dipped in dimethylamine borane and formalin successively (Japanese Patent Application Laid-Open No. 160564/1993) and the like.

However, the methods disclosed in Japanese Patent Publication No. 8479/1989 and Japanese Patent Application Laid-Open No. 156479/1989 have such problems that it is difficult to reduce the copper oxide layer to copper to a sufficient degree and that the treatment time and the treatment temperature must be severely restricted. The method using dimethylamine borane has the problem that a life of the treatment solution is not long because dimethylamine borane is easily decomposed. Further, reducing agents such as sodium borohydride and dimethylamine borane are expensive and interfere with a reduction in the costs for the reduction treatment.

SUMMARY OF THE INVENTION

The present invention has been invented under the above circumstances. It is the object of the present invention to provide a treatment solution and a treatment method for obtaining a copper material having excellent adhesion to resins and acid resistance.

The present invention has been completed by studying a treatment solution which can still reduce a copper oxide to copper despite a decrease in the concentration of dimethylamine borane and finding that there is a special relationship between an area to be treated (area of copper material having a copper oxide dipped in the treatment solution) and the minimum required amount of dimethylamine borane.

That is, the treatment solution of the present invention for reducing a copper oxide is a treatment solution for reducing a copper oxide formed on the surface of copper to copper, in which dimethylamine borane is contained in an amount of 0.3 to 2.0 g/L and the relationship $y \geq 0.232 x^{-0.185}$ holds between the concentration y (g/L) of dimethylamine borane and an area x ($dm^2$/L) to be treated per unit solution amount.

Further, the treatment solution of the present invention for reducing a copper oxide is also a treatment solution for reducing a copper oxide formed on the surface of copper to copper, in which dimethylamine borane is contained in an amount of 0.15 to 2.0 g/L, 37% formalin is contained in an amount of 0.5 to 100 mL/L, the pH is 12 or more, and the relationship $y \geq 0.215 x^{-0.168}$ holds between the concentration y (g/L) of dimethylamine borane and an area x ($dm^2$/L) to be treated per unit solution amount. A preferable embodiment of the treatment solution of the present invention is such that the relationship $y \geq -0.106z + 1.57$ holds between the concentration y (g/L) of dimethylamine borane and the value z of the pH of the treatment solution.

The treatment method of the present invention for reducing a copper oxide is a treatment method for reducing a copper oxide formed on the surface of a copper material by oxidation to copper by dipping the copper material in the treatment solution, in which the treatment solution is prepared by adding dimethylamine borane to water in such a manner that the concentration of dimethylamine borane is 0.3 to 2.0 g/L and that the relationship $y \geq 0.232 x^{-0.185}$ holds between the concentration y (g/L) of dimethylamine borane and an area x ($dm^2$/L) to be treated of the copper material per unit solution amount, and the addition of dimethylamine borane to water is carried out within 10 minutes before the dipping of the copper material having the copper oxide on the surface or after the dipping of the copper material.

Further, the treatment method of the present invention for reducing a copper oxide is also a treatment method for reducing a copper oxide formed on the surface of a copper material by oxidation to copper by dipping the copper material in the treatment solution, in which the treatment solution is prepared by adding dimethylamine borane to a base bath in such a manner that the concentration of dimethylamine borane is 0.15 to 2.0 g/L and that the relationship $y \geq 0.215 x^{-0.168}$ holds between the concentration y (g/L) of dimethylamine borane and an area x ($dm^2$/L) to be treated of the copper material per unit solution amount; the base bath contains 0.5 to 100 mL/L of 37% formalin; the pH is 12 or more; the addition of dimethylamine borane to the base bath is carried out within 10 minutes before the dipping of the copper material having the copper oxide on the surface or after the dipping of the copper material; and the relationship $y \geq -0.106z + 1.57$ holds between the concentration y (g/L) of dimethylamine borane and the value z of the pH of the treatment solution.

The treatment solution of the present invention contains expensive dimethylamine borane in a less amount than conventional treatment solutions. Particularly, since the minimum required amount of dimethylamine borane decreases along with an increase in the area to be treated, the costs required for reducing the copper oxide to copper can be decreased. Further, in the treatment method for reducing the copper oxide to copper, a decrease in the costs for the treatment by decreasing the amount of expensive dimethylamine borane to be added can be achieved, and an increase in the costs for the treatment can be prevented by preventing a reduction in the useful life of the treatment solution by decomposition of dimethylamine borane.

DETAILED DESCRIPTION OF THE PREFERRED EMBODIMENT

[First Embodiment of Treatment Solution]

The treatment solution of the present invention for reducing a copper oxide is an aqueous solution which contains dimethylamine borane in an amount of 0.3 to 2.0 g/L and for which the relationship $y \geq 0.232x^{-0.185}$ holds between the concentration y (g/L) of dimethylamine borane and an area x (dm$^2$/L) to be treated per unit treatment solution amount. Thus, the treatment solution of the present invention is based on the special relationship that the minimum required amount of dimethylamine borane decreases along with an increase in the area to be treated.

When the concentration of dimethylamine borane in the treatment solution is lower than 0.3 g/L or does not satisfy the above relationship $y \geq 0.232x^{-0.185}$, a reduction does not occur at all or does not fully proceed disadvantageously. On the other hand, when the concentration of dimethylamine borane in the treatment solution is higher than 2.0 g/L, a further effect caused by the addition of dimethylamine borane cannot be obtained and, what is worse, the costs are increased by an increase in the amount of expensive dimethylamine borane added disadvantageously.

When a copper oxide such as copper (I) oxide or copper (II) oxide is reduced to copper by using the treatment solution of the present invention, the temperature of the treatment solution is not particularly limited. For example, when the area to be treated on the substrate is 1 dm$^2$/L and 1.0 g/L of dimethylamine borane is added, the temperature of the treatment solution can be set to be in the range of 25 to 60° C., and the treatment (dipping) time can be set to be 2 to 6 minutes.

[Second Embodiment of Treatment Solution]

The treatment solution of the present invention for reducing a copper oxide is an aqueous solution which contains dimethylamine borane in an amount of at least 0.15 to 2.0 g/L and 37% formalin in an amount of 0.5 to 100 mL/L and has a pH of at least 12 and for which the relationship $y \geq 0.215x^{-0.168}$ holds between the concentration y (g/L) of dimethylamine borane and an area x (dm$^2$/L) to be treated per unit solution amount. Thus, the treatment solution of the present invention is based on the special relationship that the minimum required amount of dimethylamine borane decreases along with an increase in the area to be treated. It is considered that the above special relationship holds because more copper is produced by reduction by dimethylamine borane as the area to be treated becomes larger and because the reduction reaction by formalin using the copper as a catalyst can therefore be carried out more efficiently.

When the concentration of dimethylamine borane in the treatment solution is lower than 0.15 g/L or does not satisfy the above relationship $y \geq 0.215x^{-0.168}$, a reduction does not occur at all or does not fully proceed disadvantageously. On the other hand, when the concentration of dimethylamine borane in the treatment solution is higher than 2.0 g/L, a further effect caused by the addition of dimethylamine borane cannot be obtained and, what is worse, the costs are increased by an increase in the amount of expensive dimethylamine borane added disadvantageously.

When the concentration of 37% formalin in the treatment solution is lower than 0.5 mL/L, the reduction by formalin using the copper produced by reduction by dimethylamine borane as a catalyst does not fully proceed disadvantageously. On the other hand, when the concentration of 37% formalin is higher than 100 mL/L, the working environment deteriorates, and a further effect by an increase in the concentration cannot be obtained.

The pH of the treatment solution of the present invention can be adjusted by using sodium hydroxide, potassium hydroxide, sodium phosphate or the like. When the pH is smaller than 12, the reduction does not occur at all or does not fully proceed disadvantageously. In the present invention, it is preferable that the relationship $y \geq -0.106z + 1.57$ hold between the concentration y (g/L) of dimethylamine borane and the value z of the pH of the treatment bath.

When a copper oxide such as copper (I) oxide or copper (II) oxide is reduced to copper by using the treatment solution of the present invention, the temperature of the treatment solution is not particularly limited. For example, when the area to be treated on the substrate is 1 dm$^2$/L and 1.0 g/L of dimethylamine borane is added, the temperature of the treatment solution can be set to be in the range of 25 to 65° C., and the treatment (dipping) time can be set to be 1.5 to 4.5 minutes.

[First Embodiment of Treatment Method]

The treatment method of the present invention for reducing a copper oxide is a treatment method for reducing a copper oxide formed on the surface of a copper material by oxidation to copper by dipping the copper material in a treatment solution, and the treatment solution is the one prepared by adding dimethylamine borane to water in such a manner that the concentration of dimethylamine borane is 0.3 to 2.0 g/L and that the relationship $y \geq 0.232x^{-0.185}$ holds between the concentration y (g/L) of dimethylamine borane and an area x (dm$^2$/L) to be treated of the copper material per unit solution amount. The addition of dimethylamine borane to water in the preparation of the treatment solution is carried out within 10 minutes before the dipping of the copper material having the copper oxide on the surface or after the dipping of the copper material.

In the treatment method of the present invention, the dimethylamine borane added to water may be in the form of powder or an aqueous solution. When the time between the addition of dimethylamine borane to water and the dipping (reduction treatment) is long, dimethylamine borane decomposes, whereby the reduction does not occur at all or does not fully proceed disadvantageously.

Further, when the concentration of dimethylamine borane in the treatment solution used in the treatment method of the present invention is lower than 0.3 g/L or does not satisfy the above relationship $y \geq 0.232x^{-0.185}$, the reduction does not occur at all or does not fully proceed disadvantageously. On the other hand, when the concentration of dimethylamine borane in the treatment solution is higher than 2.0 g/L, a further effect caused by the addition of dimethylamine borane cannot be obtained and, what is worse, the costs are increased by an increase in the amount of expensive dimethylamine borane used disadvantageously.

When a copper oxide (copper (I) oxide or copper (II) oxide) formed on the surface of a copper by oxidation is subjected to the treatment for reducing the copper oxide, the temperature of the treatment solution is not particularly limited. For example, when the area to be treated on the substrate is 1 dm$^2$/L and 1.0 g/L of dimethylamine borane is added, the temperature of the treatment solution can be set to be in the range of 25 to 60° C., and the treatment (dipping) time can be set to be 2 to 6 minutes. When the above concentration or the above relationship is no longer satisfied by consuming dimethylamine borane by the treatment, dimethylamine borane can be added as appropriate within 10 minutes before the dipping of the copper material or after the dipping of the copper material.

[Second Embodiment of Treatment Method]

The treatment method of the present invention for reducing a copper oxide is a treatment method for reducing a copper oxide formed on the surface of a copper material by oxidation to copper by dipping the copper material in a treatment solution, and the treatment solution is a treatment solution which has a dimethylamine borane concentration of at least 0.15 to 2.0 g/L, a 37% formalin concentration of 0.5 to 100 mL/L and a pH of at least 12 and for which the relationship $y \geq 0.215x^{-0.168}$ holds between the concentration y (g/L) of dimethylamine borane and an area x (dm$^2$/L) to be treated of the copper material per unit solution amount. The treatment solution is prepared by adding dimethylamine borane to a base bath containing 0.5 to 100 mL/L of 37% formalin and having a pH of 12 or more, and the addition of dimethylamine borane to the base bath is carried out within 10 minutes before the dipping of the copper material having the copper oxide on the surface or after the dipping of the copper material.

In the treatment method of the present invention, the dimethylamine borane added to the base bath may be in the form of powder or an aqueous solution. When the time between the addition of dimethylamine borane to the base bath and the dipping (reduction treatment) is long, dimethylamine borane decomposes, whereby the reduction does not occur at all or does not fully proceed disadvantageously.

Further, when the concentration of dimethylamine borane in the treatment solution used in the treatment method of the present invention is lower than 0.15 g/L or does not satisfy the above relationship $y \geq 0.215x^{-0.168}$, the reduction does not occur at all or does not fully proceed disadvantageously. On the other hand, when the concentration of dimethylamine borane in the treatment solution is higher than 2.0 g/L, a further effect caused by the addition of dimethylamine borane cannot be obtained and, what is worse, the costs are increased by an increase in the amount of expensive dimethylamine borane used disadvantageously.

When the concentration of 37% formalin in the base bath (treatment solution) is lower than 0.5 mL/L, the reduction by formalin using the copper produced by reduction by dimethylamine borane as a catalyst does not fully proceed disadvantageously. On the other hand, when the concentration of 37% formalin is higher than 100 mL/L, the working environment deteriorates, and a further effect by an increase in the concentration cannot be obtained.

The pH of the base bath (treatment solution) of the present invention can be adjusted by using sodium hydroxide, potassium hydroxide, sodium phosphate or the like. In the present invention, it is preferable that the relationship $y \geq -0.106z+1.57$ hold between the concentration y (g/L) of dimethylamine borane and the value z of the pH of the treatment bath. When the pH is smaller than 12, the reduction does not occur at all or does not fully proceed disadvantageously.

When a copper oxide (copper (I) oxide or copper (II) oxide) formed on the surface of a copper by oxidation is subjected to the treatment for reducing the copper oxide, the temperature of the treatment solution is not particularly limited. For example, when the area to be treated on the substrate is 1 dm$^2$/L and 1.0 g/L of dimethylamine borane is added, the temperature of the treatment solution can be set to be in the range of 25 to 65° C., and the treatment (dipping) time can be set to be 1.5 to 4.5 minutes. When the above concentration or the above relationship is no longer satisfied by consuming dimethylamine borane by the treatment, dimethylamine borane can be added as appropriate within 10 minutes before the dipping of the copper material or after the dipping of the copper material. Further, when formalin is consumed by the treatment and the pH is lowered, formalin is added as appropriate and sodium hydroxide or the like is also added as appropriate in order for the above condition to be satisfied.

Next, the present invention will be described in more detail with reference to specific examples.

EXAMPLE 1

Firstly, 1-mm-thick copper substrates (25.5 cm×25.5 cm) having a 35-$\mu$m-thick copper layer formed by electrolytic plating were subjected to pretreatment (in which the substrate was dipped in ENPLATE PC-499 manufactured by MELTEX Inc. at 70° C. for 5 minutes, washed with water, dipped in MELPLATE AD-331 manufactured by MELTEX Inc. at 25° C. for 1 minute, washed with water, dipped in a 10% sulfuric acid aqueous solution at room temperature for 1 minute, washed with water, and dipped in a 35 mL/L aqueous solution of ENPLATE MB-438A manufactured by MELTEX Inc. at room temperature for 1 minute). Thereafter, the pretreated substrates were dipped (at 80° C. for 5 minutes) in an aqueous solution containing 80 mL/L of ENPLATE MB-438A manufactured by MELTEX Inc. and 130 mL/L of ENPLATE MB-438B manufactured by MELTEX Inc. and then washed to form a copper oxide thin film on the surface. This copper oxide thin film had roughness on the surface.

Then, treatment solutions (samples 1-1 to 1-15) were prepared by adding dimethylamine borane to water to the concentrations shown in the following Tables 1 and 2, and after 5 minutes from the preparation, the above copper substrates having the copper oxide formed on the surface were dipped (at 50° C. for 5 minutes) to reduce the copper oxide. The amounts of the treatment solutions were adjusted such that the areas to be treated of the copper substrates per unit solution amount should be those shown in the following Tables 1 and 2.

After reduced as described above and dried, the copper substrates were dipped in a 50% hydrochloric acid aqueous solution for 10 minutes, and the presence or absence of the dissolved copper oxide was confirmed by a change in the color of the copper substrates. The evaluation of the reduction treatment was made based on the following criteria, and the results are shown in the following Tables 1 and 2.

(Evaluation Criteria for Reduction Treatment)

◯: No discoloration was observed after the dipping in the 50% hydrochloric acid aqueous solution, and the reduction treatment was good.

Δ: Discoloration was observed on some spots after the dipping in the 50% hydrochloric acid aqueous solution, and the reduction treatment was somewhat insufficient.

×: Discoloration was observed after the dipping in the 50% hydrochloric acid aqueous solution, and the reduction treatment was insufficient.

TABLE 1

| Treatment Solution Sample | DMAB Concentration y (g/L) | Area x to be Treated Per Unit Solution Amount (dm²/L) | Validity of Relation $y \geq 0.232x^{-0.185}$ | Evaluation of Reduction Treatment |
|---|---|---|---|---|
| 1-1 | 0.1 | 5 | Did not hold | x |
|  |  | 7 | Did not hold | x |
|  |  | 10 | Did not hold | x |
| 1-2 | 0.15 | 5 | Did not hold | x |
|  |  | 7 | Did not hold | x |
|  |  | 10 | Held | o |
| 1-3 | 0.17 | 2 | Did not hold | x |
|  |  | 3 | Did not hold | x |
|  |  | 5 | Held | o |
|  |  | 7 | Held | o |
|  |  | 10 | Held | o |
| 1-4 | 0.19 | 1 | Did not hold | x |
|  |  | 2 | Did not hold | x |
|  |  | 3 | Held | o |
|  |  | 5 | Held | o |
|  |  | 7 | Held | o |
| 1-5 | 0.21 | 0.5 | Did not hold | x |
|  |  | 1 | Did not hold | x |
|  |  | 2 | Held | o |
|  |  | 3 | Held | o |
|  |  | 5 | Held | o |
| 1-6 | 0.23 | 0.25 | Did not hold | x |
|  |  | 0.5 | Did not hold | x |
|  |  | 1 | Held | o |
|  |  | 2 | Held | o |
|  |  | 3 | Held | o |
| 1-7 | 0.25 | 0.25 | Did not hold | x |
|  |  | 0.5 | Did not hold | x |
|  |  | 1 | Held | o |
|  |  | 2 | Held | o |
|  |  | 3 | Held | o |

TABLE 2

| Treatment Solution Sample | DMAB Concentration y (g/L) | Area x to be Treated Per Unit Solution Amount (dm²/L) | Validity of Relation $y \geq 0.232x^{-0.185}$ | Evaluation of Reduction Treatment |
|---|---|---|---|---|
| 1-8 | 0.3 | 0.25 | Held | o |
|  |  | 0.5 | Held | o |
|  |  | 1 | Held | o |
|  |  | 2 | Held | o |
| 1-9 | 0.5 | 5 | Held | o |
| 1-10 | 1.0 | 5 | Held | o |
| 1-11 | 1.5 | 5 | Held | o |
| 1-12 | 2.0 | 5 | Held | o |
| 1-13 | 3.0 | 5 | Held | o |
| 1-14 | 5.0 | 5 | Held | o |
| 1-15 | 10.0 | 5 | Held | o |

As shown in Tables 1 and 2, when the concentration of dimethylamine borane was 0.3 g/L or higher and the relationship $y \geq 0.232x^{-0.185}$ held between the concentration y (g/L) of dimethylamine borane and an area x (dm²/L) to be treated of the copper substrate per unit solution amount, the copper oxide formed on the surface of the copper substrate was reduced to copper. Further, when the concentration of dimethylamine borane was 2.0 g/L or higher, no significant improvement in the reducing effect was observed.

EXAMPLE 2

Firstly, copper oxide thin films were formed on the surface of copper substrates in the same manner as in Example 1.

Then, treatment solutions (samples 2-1 to 2-15) were prepared by adding dimethylamine borane to a base bath (pH=13) having the following composition to the concentrations shown in the following Tables 3 and 4, and after 5 minutes from the preparation, the above copper substrates having the copper oxide formed on the surface were dipped (at 50° C. for 5 minutes) to reduce the copper oxide. The amounts of the treatment solutions were adjusted such that the areas to be treated of the copper substrates per unit solution amount should be those shown in the following Tables 3 and 4.

(Composition of Base Bath)

37% formalin . . . 10 mL/L sodium hydroxide . . . 10 g/L water . . . balance

After reduced as described above and dried, the copper substrates were dipped in a 50% hydrochloric acid aqueous solution for 10 minutes. The evaluation of the reduction treatment was made based on the same criteria as used in Example 1, and the results are shown in the following Tables 3 and 4.

TABLE 3

| Treatment Solution Sample | DMAB Concentration y (g/L) | Area x to be Treated Per Unit Solution Amount (dm²/L) | Validity of Relation $y \geq 0.215x^{-0.168}$ | Evaluation of Reduction Treatment |
|---|---|---|---|---|
| 2-1 | 0.1 | 5 | Did not hold | x |
|  |  | 7 | Did not hold | x |
|  |  | 10 | Did not hold | x |
| 2-2 | 0.15 | 5 | Did not hold | x |
|  |  | 7 | Did not hold | x |
|  |  | 10 | Held | o |
| 2-3 | 0.17 | 2 | did not hold | x |
|  |  | 3 | did not hold | x |
|  |  | 5 | Held | o |
|  |  | 7 | Held | o |
|  |  | 10 | Held | o |
| 2-4 | 0.19 | 1 | Did not hold | x |
|  |  | 2 | Did not hold | x |
|  |  | 3 | Held | o |
|  |  | 5 | Held | o |
|  |  | 7 | Held | o |
| 2-5 | 0.21 | 0.5 | Did not hold |  |
|  |  | 1 | Did not hold | x |
|  |  | 2 | Held | o |
|  |  | 3 | Held | o |
|  |  | 5 | Held | o |
| 2-6 | 0.23 | 0.25 | Did not hold | x |
|  |  | 0.5 | Did not hold | x |
|  |  | 1 | Held | o |
|  |  | 2 | Held | o |
|  |  | 3 | Held | o |
| 2-7 | 0.25 | 0.25 | Did not hold | x |
|  |  | 0.5 | Held | o |
|  |  | 1 | Held | o |
|  |  | 2 | Held | o |
|  |  | 3 | Held | o |

TABLE 4

| Treatment Solution Sample | DMAB Concentration y (g/L) | Area x to be Treated Per Unit Solution Amount (dm²/L) | Validity of Relation $y \geq 0.232x^{-0.185}$ | Evaluation of Reduction Treatment |
|---|---|---|---|---|
| 2-8 | 0.3 | 0.25 | Held | o |
|  |  | 0.5 | Held | o |
|  |  | 1 | Held | o |
|  |  | 2 | Held | o |
| 2-9 | 0.5 | 5 | Held | o |
| 2-10 | 1.0 | 5 | Held | o |
| 2-11 | 1.5 | 5 | Held | o |
| 2-12 | 2.0 | 5 | Held | o |
| 2-13 | 3.0 | 5 | Held | o |

TABLE 4-continued

| Treatment Solution Sample | DMAB Concentration y (g/L) | Area x to be Treated Per Unit Solution Amount (dm²/L) | Validity of Relation $y \geq 0.232x^{-0.185}$ | Evaluation of Reduction Treatment |
|---|---|---|---|---|
| 2-14 | 5.0 | 5 | Held | ○ |
| 2-15 | 10.0 | 5 | Held | ○ |

As shown in Tables 3 and 4, when the concentration of dimethylamine borane was 0.15 g/L or higher and the relationship $y \geq 0.215x^{-0.168}$ held between the concentration y (g/L) of dimethylamine borane and an area x (dm²/L) to be treated of the copper substrate per unit solution amount, the copper oxide formed on the surface of the copper substrate was reduced to copper. Further, when the concentration of dimethylamine borane was 2.0 g/L or higher, no significant improvement in the reducing effect was observed.

EXAMPLE 3

Firstly, copper oxide thin films were formed on the surface of copper substrates in the same manner as in Example 1.

Then, treatment solutions (samples 3-1 to 3-10) whose concentration of dimethylamine borane, concentration of 37% formalin and pH are set as shown in the following Table 5 were prepared. These treatment solutions were prepared by adding dimethylamine borane to a formalin-containing base bath, and after 5 minutes from the preparation, the above copper substrates having the copper oxide formed on the surface were dipped (at 50° C. for 5 minutes) to reduce the copper oxide. The pHs were adjusted by varying the amount of sodium hydroxide added. The amounts of the treatment solutions were adjusted such that the areas to be treated of the copper substrates per unit solution amount should be those shown in the following Table 5.

After reduced as described above and dried, the copper substrates were dipped in a 50% hydrochloric acid aqueous solutions for 10 minutes. The evaluation of the reduction treatment was made based on the same criteria as used in Example 1, and the results are shown in the following Table 5.

solution amount, the copper oxide formed on the surface of the copper substrate was reduced to copper.

Further, when the relationship $y \geq -0.106z+1.57$ held between the concentration y (g/L) of dimethylamine borane and the value z of the pH of the treatment bath, the copper oxide formed on the surface of the copper substrate was reduced to copper. However, as in the case of sample 3-6 where the relationship $y \geq -0.106z+1.57$ did not hold, the copper oxide may still be reduced to copper in some cases. However, there was not observed the case where the copper oxide was not fully reduced to copper when the relationship $y \geq -0.106z+1.57$ held.

EXAMPLE 4

Firstly, copper oxide thin films were formed on the surface of copper substrates in the same manner as in Example 1.

Then, using a treatment solution prepared by adding dimethylamine borane to a base bath (pH=13) having the following composition to a concentration of 0.20 g/L, the above copper substrates having the copper oxide formed on the surface were reduced. That is, the copper substrates were reduced by dipping them in the treating solution (at 50° C. for 5 minutes) after 24 hours, 6 hours, 1 hour, 30 minutes, 15 minutes, 10 minutes, 5 minutes and 0 minute, respectively, from the preparation of the treatment solution by adding dimethylamine borane to the base bath. Further, the copper substrates were dipped in the base bath, and after 5 minutes, dimethylamine borane was added to carry out reduction. The area to be treated on the substrate to be dipped per unit solution amount was set to be 1 (dm²/L).
(Composition of Base Bath)

37% formalin . . . 10 mL/L sodium hydroxide . . . 10 g/L water . . . balance

After reduced as described above and dried, the copper substrates were dipped in a 50% hydrochloric acid aqueous solution for 10 minutes, and the evaluation of the reduction treatment was made. As a result, when the time between the addition of dimethylamine borane to the base bath and the dipping of the copper substrates was within 10 minutes, and when dimethylamine borane was added after the copper substrates were dipped in the base bath, the copper oxide formed on the surface of the copper substrate was reduced to copper.

TABLE 5

| Treatment Solution Sample | DMAB Concentration y (g/L) | 37% Formalin Concentration (mL/L) | pH | Area x to be Treated Per Unit Solution Amount (dm²/L) | Validity of Relation $y \geq 0.215x^{-0.168}$ | Validity of Relation $y \geq -0.106z + 1.57$ | Evaluation of Reduction Treatment |
|---|---|---|---|---|---|---|---|
| 3-1 | 0.28 | 5 | 12.17 | 1 | Held | Held | ○ |
| 3-2 | 0.24 | 5 | 12.65 | 1 | Held | Held | ○ |
| 3-3 | 0.22 | 5 | 12.72 | 1 | Held | Held | ○ |
| 3-4 | 0.17 | 5 | 12.97 | 1 | Did not hold | Did not hold | x |
| 3-5 | 0.10 | 5 | 13.70 | 1 | Did not hold | Did not hold | x |
| 3-6 | 0.24 | 10 | 12.54 | 10 | Held | Did not hold | ○ |
| 3-7 | 0.28 | 10 | 12.68 | 10 | Held | Held | ○ |
| 3-8 | 0.18 | 10 | 13.28 | 10 | Held | Held | ○ |
| 3-9 | 0.15 | 10 | 13.48 | 10 | Held | Held | ○ |
| 3-10 | 0.6 | 10 | 5.4 | 10 | Held | Did not hold | x |

As shown in Table 5, when the pH was 12 or more, the concentration of dimethylamine borane was 0.15 g/L or higher and the relationship $y \geq 0.215x^{-0.168}$ held between the concentration y (g/L) of dimethylamine borane and an area x (dm²/L) to be treated of the copper substrate per unit However, when the time between the addition of dimethylamine borane to the base bath and the dipping of the copper substrates was over 10 minutes, the copper oxide remains, whereby the reduction did not fully proceed or the reduction of the copper oxide did not occur at all in some cases.

What is claimed is:

1. A treatment solution for reducing a copper oxide formed on the surface of copper to copper, wherein dimethylamine borane is contained in an amount of 0.3 to 2.0 g/L and the relationship $y \geq 0.232x^{-0.185}$ holds between the concentration y (g/L) of dimethylamine borane and an area x (dm$^2$/L) to be treated per unit solution amount.

2. A treatment solution for reducing a copper oxide formed on the surface of copper to copper, wherein dimethylamine borane is contained in an amount of 0.15 to 2.0 g/L, 37% formalin is contained in an amount of 0.5 to 100 mL/L, the pH is 12 or more, and the relationship $y \geq 0.215x^{-0.168}$ holds between the concentration y (g/L) of dimethylamine borane and an area x (dm$^2$/L) to be treated per unit solution amount.

3. The treatment solution of claim 2, wherein the relationship $y \geq -0.106z+1.57$ holds between the concentration y (g/L) of dimethylamine borane and the value z of the pH of the treatment solution.

4. A treatment method for reducing a copper oxide formed on the surface of a copper material by oxidation to copper by dipping the copper material in a treatment solution, wherein the treatment solution is prepared by adding dimethylamine borane to water in such a manner that the concentration of dimethylamine borane is 0.3 to 2.0 g/L and that the relationship $y \geq 0.232x^{-0.185}$ holds between the concentration y (g/L) of dimethylamine borane and an area x (dm$^2$/L) to be treated of the copper material per unit solution amount, and the addition of dimethylamine borane to water is carried out within 10 minutes before the dipping of the copper material having the copper oxide on the surface or after the dipping of the copper material.

5. A treatment method for reducing a copper oxide formed on the surface of a copper material by oxidation to copper by dipping the copper material in a treatment solution, wherein the treatment solution is prepared by adding dimethylamine borane to a base bath in such a manner that the concentration of dimethylamine borane is 0.15 to 2.0 g/L and that the relationship $y \geq 0.215x^{-0.168}$ holds between the concentration y (g/L) of dimethylamine borane and an area x (dm$^2$/L) to be treated of the copper material per unit solution amount; the base bath contains 0.5 to 100 mL/L of 37% formalin; the pH is 12 or more; and the addition of dimethylamine borane to the base bath is carried out within 10 minutes before the dipping of the copper material having the copper oxide on the surface or after the dipping of the copper material.

6. The treatment method of claim 5, wherein the relationship $y \geq -0.106z+1.57$ holds between the concentration y (g/L) of dimethylamine borane and the value z of the pH of the treatment solution.

\* \* \* \* \*